United States Patent
Jex

(10) Patent No.: US 6,384,658 B1
(45) Date of Patent: May 7, 2002

(54) CLOCK SPLITTER CIRCUIT TO GENERATE SYNCHRONIZED CLOCK AND INVERTED CLOCK

(75) Inventor: Jerry G. Jex, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/676,313

(22) Filed: Sep. 29, 2000

(51) Int. Cl.[7] .............................................. H03K 3/017
(52) U.S. Cl. ...................................... 327/295; 327/171
(58) Field of Search ................................. 327/171, 141, 327/144, 161, 163, 165, 239, 251, 258, 259, 263, 269, 292, 293, 295, 296

(56) References Cited

U.S. PATENT DOCUMENTS

| | | | | |
|---|---|---|---|---|
| 4,494,021 A | * | 1/1985 | Bell et al. .................... | 307/591 |
| 5,453,707 A | * | 9/1995 | Hiratsuka et al. .............. | 326/97 |
| 5,852,378 A | * | 12/1998 | Keeth .......................... | 327/171 |
| 5,867,043 A | * | 2/1999 | Kim ............................ | 327/257 |
| 6,198,328 B1 | * | 3/2001 | Heyne et al. ................. | 327/295 |
| 6,222,411 B1 | * | 4/2001 | Chu et al. .................... | 327/295 |

* cited by examiner

Primary Examiner—My-Trang Nu Ton
(74) Attorney, Agent, or Firm—Blakely, Sokoloff, Taylor & Zafman LLP

(57) ABSTRACT

An apparatus, method and means for providing a clock signal and an inverted clock signal having corresponding rise and fall edge rates, being resistant to load variations, process variations, voltage variations, and temperature variations. The apparatus output exceeds a threshold voltage for apparatus circuit paths. In one aspect of the invention, a combination of N channel and P channel devices, viewed as symmetrical P stacks and N stacks, are utilized. Low output impedance and high gain is provided for resistance to load variations.

17 Claims, 4 Drawing Sheets

CLOCK SPLITTER CIRCUIT TO GENERATE SYNCHRONIZED CLOCK AND INVERTED CLOCK

FIELD

This invention relates to a clock splitter for high speed clocking components, more particularly, an apparatus, method and means for providing matched clock and inverted clock outputs having corresponding rise and fall edge rates, being resistant to load variations, process variations, voltage variations, and temperature variations.

BACKGROUND

In high speed components, a clock and an inverted clock pair having tightly matched edges is commonly utilized. Loaded inverter chains and logic XNOR/XOR gate pairs are two common, yet unsatisfactory, methods of providing such a clock and an inverted clock pair.

FIG. 3 depicts the prior art loaded inverter chain. Two paths of inverters generate a clock and an inverted clock. The inverted clock path uses an odd number of inversions and the clock uses an even number of inversions. Capacitive loads are added to the inverter outputs and the loads are adjusted so that the inverting path matches the total delay of the non-inverting path. The limitation of the loaded inverter chain is sensitivity to process variations. While the two paths can be adjusted to have equal delay for a given process, voltage, and temperature (PVT.) Corner, the path delays will vary significantly at other PVT. Corners because a load delay is adjusted to equal a propagation delay through an inverter. An inverter delay will vary differently than a wire or load delay over different corners.

FIG. 4a depicts the prior art XNOR logic circuit. An XOR or XNOR circuit is used for both clock and inverted clock. Both circuit outputs connect to a similar circuit. One XNOR input is connected to high (Vcc) and a second XNOR input of a distinct XNOR gate is connected to low/ground (Vss), making the clock inverted in a first path but not inverted in a second path. The inherent limitation in using an XNOR logic circuit is that the internal circuitry of the XNOR provides a different propagation delay path depending on whether the additional input is Vcc or Vss. This is true for most implementations of XNOR and XOR gates, pass gates or CMOS complementary trees.

A typical NOR tree is unbalanced having input devices A and B, shown in FIG. 4, being in series. Complementary series trees as shown in FIG. 4b are used as a remedy effort. Delay differences due to the A input, N-channel device being longer than the B input, N-channel device are compensated in a complementary fashion by the second series stack with the B input, N-channel device on top. The corresponding A and B, P-channel devices are already in parallel. A similar redundancy of a P-channel series stack balances the NOT (A)*NOT(B) side logic The inversion created by devices 1153 and 1154 is not complementary compensated and causes a delay mismatch between the two paths. Attempting to compensate for the inversion has proven to create a more complex and PVT sensitive circuit.

BRIEF DESCRIPTION OF THE DRAWINGS

Additional advantages of the invention will become apparent upon reading the following detailed description and upon reference to the drawings, in which.

DETAILED DESCRIPTION

Exemplary embodiments are described with reference to specific configurations. Those skilled in the art will appreciate that various changes and modifications can be made while remaining within the scope of the claims.

In an embodiment, the present invention overcomes the limitations of the prior art by teaching a method and apparatus for providing matched clock and inverted clock outputs, having corresponding rise and fall edge rates, with a simple circuit, a small layout, less sensitivity to process variations, voltage variations, temperature variations, and is matched well for load variations. In another embodiment, the present invention teaches matched paths, such as matched wire load for wire load and matched device delay for device delay, so path delays will track over PVT Corners. The present invention also teaches simplified circuitry, small layout footprint, and less loading on the clock input. In another embodiment, the invention can be used in logic and custom design utilizing a clock and inverted clock pair for latch or flop interleaving, and useful in high speed clocking components requiring matched clock and inverted clock trees. High speed clocking components (>100 MHz) include microprocessors, interconnect components, PC chipset components, server chipset components, and DSP ASIC components. The invention provides the matched clocks with small silicon real estate and tight skew (<10 ps) over PVT.

Figure 2:
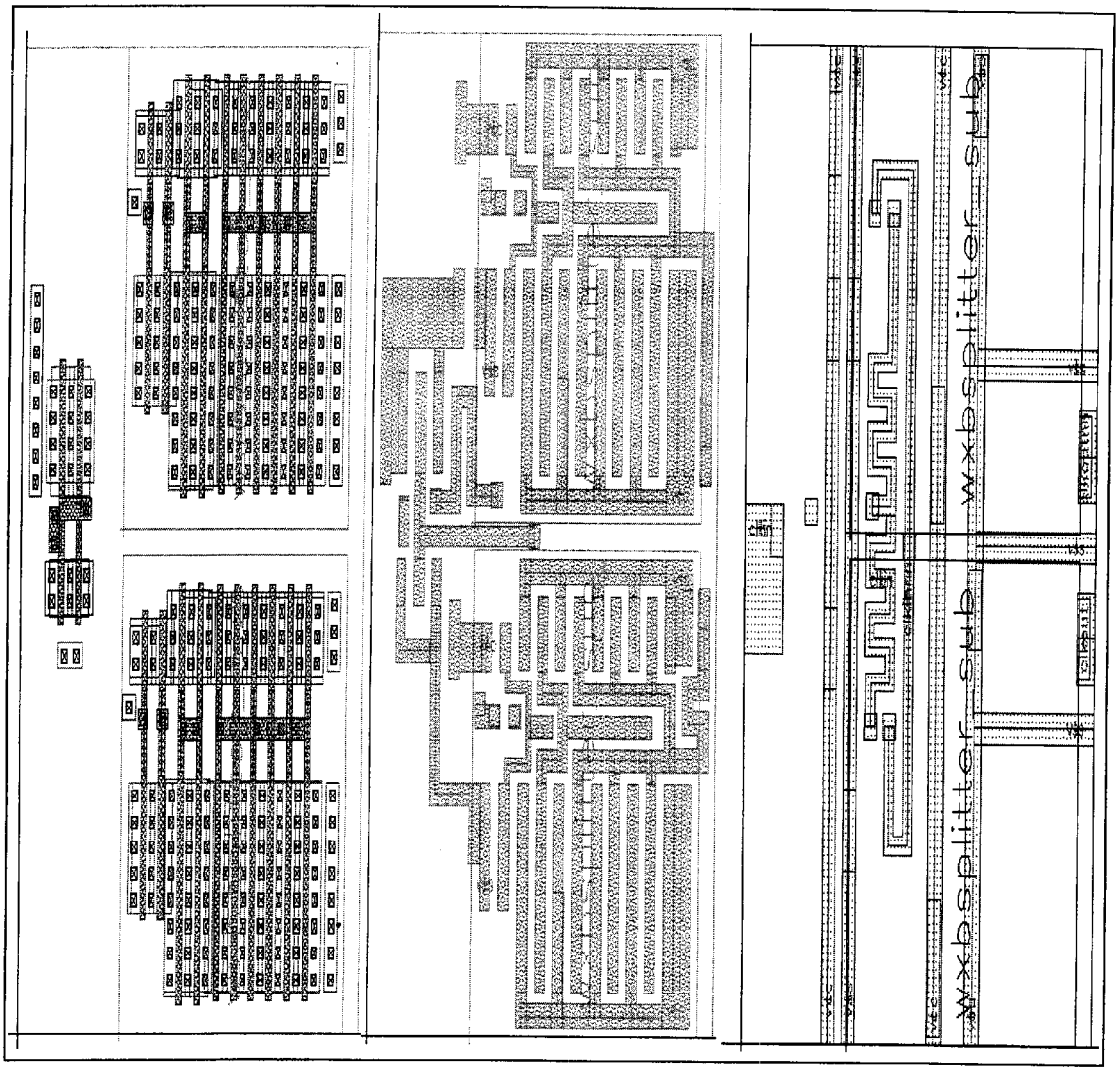
FIG. 2 depicts the metal layout of an embodiment of the present invention.
Figure 3:
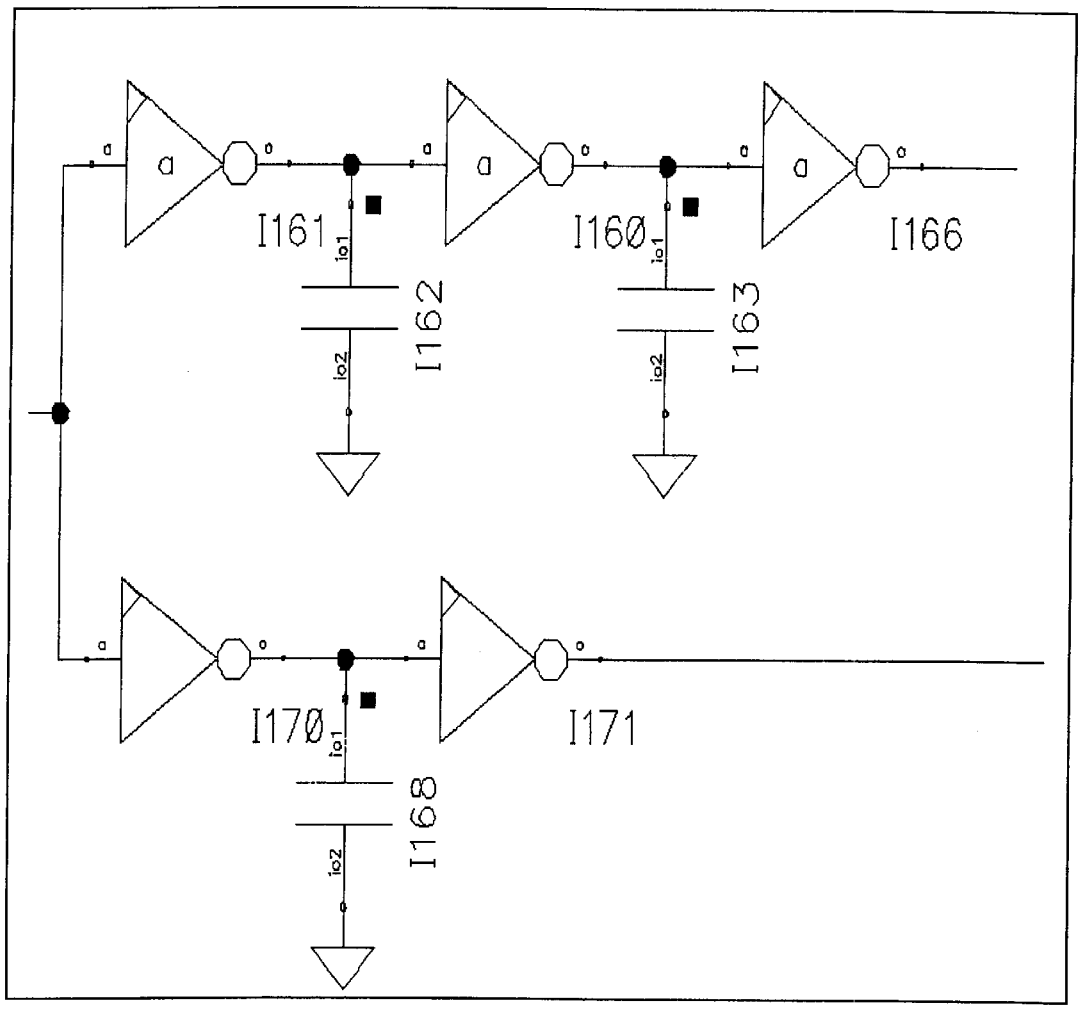
FIG. 3 depicts a prior art loaded inverter chain.
Figure 4A:
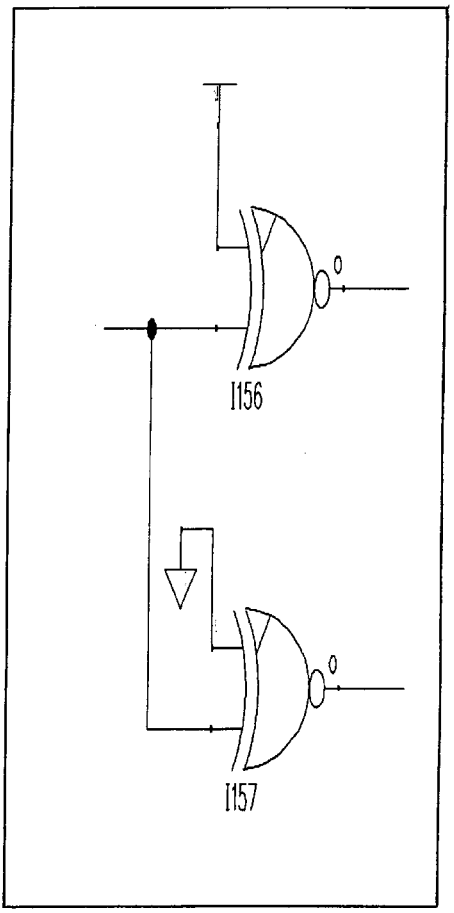
FIG. 4a depicts a prior art XNOR logic circuit.
Figure 4B:
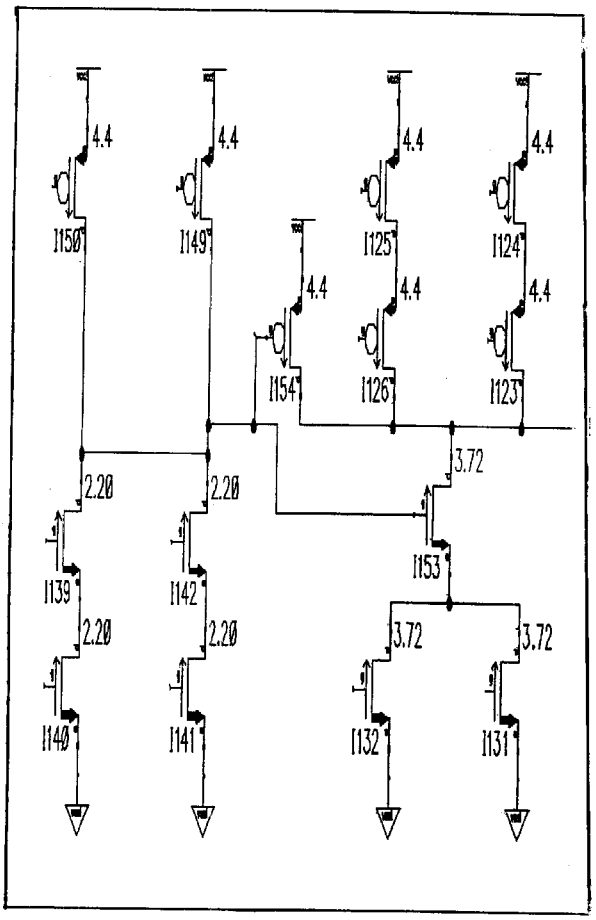
FIG. 4b depicts complementary series trees in a prior art XNOR logic circuit.

As shown in FIG. 2, the invention is compact and requires a small footprint in the component silicon. The device layout symmetry and metal trade length matching, apparent in FIG. 2, helps provide the matched propagation delay over various PTV corners and over various loads. Circuit simulations show that the clock and inverted clock output edge rates are matched between 3 and 22 ps at the threshold for a given implementation. Silicon LVP measurements confirm these values, which are below the resolution range of LVP probing. This range is over the temperature, process, and voltage skew corners, as well as over load variations from 0 to 4X.

Figure 1:
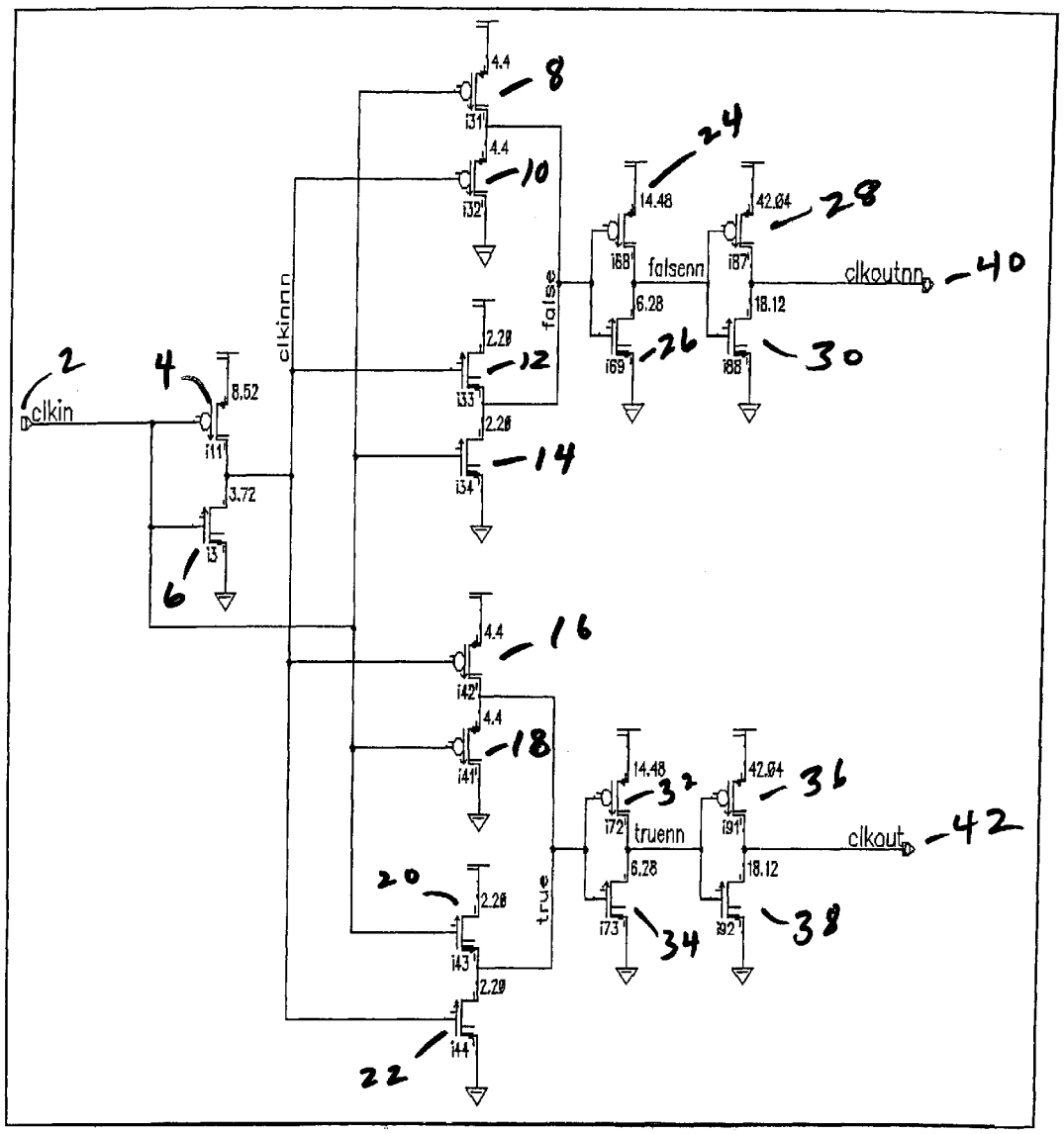
FIG. 1 is a circuit schematic functional diagram showing an embodiment of the present invention.

As shown in FIG. 1, in one embodiment, the invention is a simple circuit comprised of 5 inverters and 8 transistors. A novel combination of N channel devices 6, 12, 14, 20, 22, 26, 30, 34, 38 and P channel devices 4, 8, 10, 16, 18, 24, 28, 32, 36 provide closest matching at the fast P-device, slow N-device process corner and also at the slow P-device, fast N-device process corner. This novel combination provides an advantage over many clock/inverted clock generators that rely on P-device compensation for N-device delay or parasitic delay to provide matched output edge rates. Further, the circuit proves to be less sensitive to process variations, voltage variations and temperature variations.

In one embodiment, a clock signal and inverted clock signal is provided. The inverted clock signal is provided by P-channel device 4 and N-channel device 6, the inverted clock signal having a phase shift as compared to the clock signal. The clock signal and inverted clock signal are inputted to N-channel devices 12, 14, 20, 22, and P-channel devices 8, 10, 16, 18 for removal of the phase shift. This phase shift/mismatch is compensated for by the symmetry of the Nchannel and P-channel device structures.

In an embodiment, a method and apparatus is provided having a matched clock and inverted clock output having corresponding rise and fall edge rates for use in an integrated circuit and a chipset.

In one embodiment, as shown in FIG. 1, N channel devices 12, 14, 20, 22 and P channel devices 8, 10, 16, 18 are symmetrical pass-gates grouped together to form CMOS pass-gate pairs. For example, P channel device 8 and N channel device 12 form a CMOS pass-gate pair. P channel device 10 and N channel device 14 form a CMOS pass-gate pair. Each pass-gate has two gate-control inputs, one being the gate of one transistor for receiving a clock signal, a second being the gate of a second transistor for receiving an inverted clock signal. For example, the gate of P channel device 8 receives a clock signal, and the gate of N channel device 12 receives an inverted clock signal. Each pass-gate has one input connected to two devices. One pass-gate input is connected to a bias voltage (Vcc), and a further pass-gate input is connected to ground (Vss). For example, the source of P channel device 8 and the drain of N channel device 12 are connected to Vcc. The drain of P channel device 10 and the source of N channel device 14 are connected to Vss. The outputs of two complementary pass-gates are connected. For example, the pass gate made up of P channel device 8 and N channel device 12, and complementary pass gate made up of P channel device 10 and N channel device 14, have outputs connected. The pass-gate pair combined output provide the high and low logic level output. One pass-gate pair output provides a clock output and a second pass-gate pair output provides an inverted clock output. For example, pass gate pair composed of P channel device 8, P channel device 10, N channel device 12 and N channel device 14 provides an inverted clock output. Pass gate pair composed of P channel device 16, P channel device 18, N channel device 20 and N channel device 22 provides an inverted clock output.

In another embodiment, as shown in FIG. 2, P and N stacks are utilized. In usual CMOS logic, P-channel devices are connected to Vcc and N-channel devices are connected to Vss because there is better hole mobility in P-channel devices and better electron mobility in N devices. As depicted in FIG. 2, the P stack shows one P-channel device connected to Vic and a further P-channel device is connected to Vss. For example, P-channel device 8 is connected to Vic and P-channel device 10 is connected to Vss. The N stack shows one N device connected to Vic and a further N device is connected to Vcc. For example, N device 12 is connected to Vcc and N device 14 is connected to Vss.

When pull-up P channel device 8 is turned on, it functions as a usual CMOS circuit. When pull-down P channel device 10 is turned on, it conducts until the threshold voltage of P channel device 8 (Vpthreshold)is approached, at which time it slowly stops conducting, providing an over-damped waveform to Vpthreshold . The complementary N stack, made up of N channel device 12 and N channel device 14 is connected in parallel to the P stack, made up of P channel device 8 and P channel device 10. The drain of N channel device 12 is connected to Vcc, and the source of N channel device 14 is connected to Vss. Pull-down N-channel device 14 is active at the same time pull-down P-channel device 10 is active. Pull-down N-channel device 14 will continue to discharge its output node until it reaches Vss. A P-channel pull-up device and an N-channel pull-down device operates as an inverter. However, an accompanying N-channel pull-up and P-channel pull-down is novel and provides symmetry of the clock and inverted clock output signals. The combination of pull-down N-channel device 14 and the pull-down P-channel device 10 cause the output signal to exceed the threshold for both the clock and inverted clock circuit paths. The result is a matched clock and inverted clock output, having corresponding rise and fall edge rates.

In another embodiment, the output of devices 8, 10, 12 and 14 is input to devices 24, 26, 28, and 30 to provide low output impedance and high gain.

Additionally, the output of devices 16, 18, 20 and 22 is input to devices 32, 34, 36 and 38 to provide low output impedance and high gain.

Having disclosed exemplary embodiments, modifications and variations may be made to the disclosed embodiments while remaining within the spirit and scope of the invention as defined by the appended claims.

What is claimed is:

1. A circuit comprising:
   first and second transistors of a first conductivity type stacked between bias and return nodes to drive a first output node, third and fourth transistors of a second conductivity type that is complementary to the first conductivity type stacked between the bias and return nodes to drive the first output node, control electrodes of the second and third transistors being coupled to receive a clock signal, and control electrodes of the first and fourth transistors being coupled to receive an inverted version of the clock signal, wherein the first and second transistors have the same size, and the third and fourth transistors have the same size.
   and wherein the size of the third and fourth transistors is different than the size of the first and second transistors.

2. The circuit of claim 1 further comprising:
   fifth and sixth transistors of the first conductivity type stacked between the bias and return nodes to drive a second output node, seventh and eighth transistors of the second conductivity type stacked between the bias and return nodes to drive the second output node, control electrodes of the fifth and eighth transistors being coupled to receive the clock signal, and control electrodes of the sixth and seventh transistors being coupled to receive the inverted version of the clock signal.

3. The circuit of claim 2 wherein the fifth and sixth transistors have the same size as the first and second transistors, and the seventh and eighth transistors have the same size as the third and fourth transistors.

4. The circuit of claim 3 wherein the first, second, fifth, and sixth transistors are n-channel metal oxide semiconductor field effect transistors (N-FETs) and their control electrodes are N-FET gate electrodes, and wherein the third, fourth, seventh, and eighth transistors are p-channel metal oxide semiconductor field effect transistors (P-FETs) and their control electrodes are P-FET gate electrodes.

5. The circuit of claim 4 further comprising:
   first and second replicate pairs of cascaded, complimentary MOS inverters coupled to buffer the first and second output nodes, respectively.

6. The circuit of claim 1 wherein the first and second transistors are n-channel metal oxide semiconductor field effect transistors (N-FETs) and their control electrodes are N-FET gate electrodes.

7. The circuit of claim 6 wherein the third and fourth transistors are p-channel metal oxide semiconductor field effect transistors (P-FETs) and their control electrodes are P-FET gate electrodes.

8. A circuit comprising:
   first and second pass gates that are coupled between return and bias nodes, respectively, and a first output node, third and fourth pass gates that are coupled between the return and bias nodes, respectively, and the first output node, wherein control electrodes of the second and third pass gates are coupled to receive a clock signal, and control electrodes of the first and fourth pass gates are coupled to receive an inverted version of the clock signal, wherein the first and second pass gates include first and second transistors, respectively, of a first conductivity type that have the same size, and wherein the third and fourth pass gates include third and fourth transistors, respectively, of a second conductivity type that is complementary to the first conductivity type and that have the same size and wherein the size of the third and fourth transistors is different than the size of the first and second transistors.

9. The circuit of claim 8 further comprising:

fifth and sixth pass gates that are coupled between the return and bias nodes, respectively, and a second output node, seventh and eighth pass gates that are coupled between the return and bias nodes, respectively, and the second output node, wherein control electrodes of the fifth and eighth pass gates are coupled to receive the clock signal, and control electrodes of the sixth and seventh pass gates are coupled to receive the inverted version of the clock signal.

10. The circuit of claim 9 wherein the fifth and sixth pass gates include fifth and sixth transistors, respectively, of the first conductivity type and that have the same size as the first and second transistors, and wherein the seventh and eighth pass gates include seventh and eighth transistors, respectively, of the second conductivity type and that have the same size as the third and fourth transistors.

11. The circuit of claim 10 wherein the first, second, fifth, and sixth transistors are n-channel metal oxide semiconductor (MOS) field effect transistors, and wherein the third, fourth, seventh, and eighth transistors are p-channel MOS field effect transistors.

12. The circuit of claim 10 further comprising:

first and second replicate pairs of cascaded, complimentary MOS inverters coupled to buffer the first and second output nodes, respectively.

13. The circuit of claim 8 wherein each of the first and second pass gates includes an n-channel metal oxide semiconductor field effect transistor whose gate electrode is the control electrode of the respective pass gate.

14. The circuit of claim 13 wherein each of the third and fourth pass gates includes a p-channel metal oxide semiconductor field effect transistor whose gate electrode is the control electrode of the respective pass gate.

15. A method comprising:

providing a first pass gate as coupled between a return node and a first output node;

providing a second pass gate as coupled between. a bias node and the first output node;

providing a third pass gate as coupled between the return node and the first output node;

providing a fourth pass gate as coupled between the bias node and the first output node;

applying the same clock signal to each control electrode of the second and third pass gates; and applying the same inverted clock signal to each control electrode of the first and fourth pass gates, wherein the first and second pass gates are provided with first and second transistors, respectively, of a first conductivity type that have the same size, and wherein the third and fourth pass gates are provided with third and fourth transistors, respectively, of a second conductivity type that is complementary to the first conductivity type and that have the same size and wherein the size of the third and fourth transistors is different than the size of the first and second transistors.

16. The method of claim 15 further comprising:

providing a fifth pass gate as coupled between the return node and a second output node;

providing a sixth pass gate as coupled between the bias node and the second output node;

providing a seventh pass gate as coupled between the return node and the second output node;

providing an eighth pass gate as coupled between the bias node and the second output node;

applying the same clock signal to each control electrode of the fifth and eighth pass gates; and applying the same inverted clock signal to each control electrode of the sixth and seventh pass gates.

17. The method of claim 16 wherein the fifth and sixth pass gates are provided with fifth and sixth transistors, respectively, of the first conductivity type and that have the same size as the first and second transistors, and wherein the seventh and eighth pass gates are provided with seventh and eighth transistors, respectively, of the second conductivity type and that have the same size as the third and fourth transistors.

\* \* \* \* \*